(12) United States Patent
Mouli (10) Patent No.: US 8,035,142 B2
(45) Date of Patent: Oct. 11, 2011

(54) DEUTERATED STRUCTURES FOR IMAGE SENSORS AND METHODS FOR FORMING THE SAME

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 620 days.

(21) Appl. No.: 10/885,650

(22) Filed: Jul. 8, 2004

(65) Prior Publication Data

US 2006/0006436 A1 Jan. 12, 2006

(51) Int. Cl.
*H01L 31/062* (2006.01)

(52) U.S. Cl. ........ 257/290; 257/291; 257/292; 257/293; 257/510; 257/E27.133

(58) Field of Classification Search .................. 257/290, 257/291, 292, 293, 510, E27.133
See application file for complete search history.

(56) References Cited

U.S. PATENT DOCUMENTS

| | | | | |
|---|---|---|---|---|
| 5,872,387 A | * | 2/1999 | Lyding et al. .................. | 257/607 |
| 5,972,765 A | * | 10/1999 | Clark et al. .................... | 438/308 |
| 6,114,734 A | * | 9/2000 | Eklund .......................... | 257/410 |
| 6,143,632 A | * | 11/2000 | Ishida et al. ................... | 438/543 |
| 6,147,014 A | | 11/2000 | Lyding et al. | |
| 6,232,626 B1 | * | 5/2001 | Rhodes .......................... | 257/292 |
| 6,521,977 B1 | * | 2/2003 | Burnham et al. .............. | 257/649 |
| 6,545,302 B2 | * | 4/2003 | Han ................................ | 257/222 |
| 6,569,700 B2 | * | 5/2003 | Yang ............................... | 438/48 |
| 6,678,301 B1 | | 1/2004 | Eng et al. | |
| 7,087,507 B2 | | 8/2006 | Koldiaev et al. | |
| 2002/0047169 A1 | * | 4/2002 | Kunikiyo ....................... | 257/410 |
| 2004/0036786 A1 | * | 2/2004 | Takayanagi et al. .......... | 348/308 |
| 2004/0089914 A1 | * | 5/2004 | Mouli et al. ................... | 257/510 |
| 2004/0094784 A1 | * | 5/2004 | Rhodes et al. ................ | 257/291 |
| 2005/0269606 A1 | * | 12/2005 | Mouli ............................ | 257/292 |

OTHER PUBLICATIONS

H.-H. Tseng et al.—"ALD $HfO_2$ using Heavy Water ($D_2O$) for Improved MOSFET Stability," IEEE 2000, 4 pages.
Jinju Lee et al.—"Application of High Pressure Deuterium Annealing for Improving the Hot Carrier Reliability of CMOS Transistors," IEEE Electron Device Letters, vol. 21, No. 5, May 2000, pp. 221-223.
D. Misra et al.—"Reliability of Thin Oxides Grown on Deuterium Implanted Silicon Substrate," IEEE Transactions on Electron Devices, vol. 48, No. 4, May 2001, pp. 1015-1016.
Kangguo Cheng et al.—"Deuterium Passivation of Interface Traps in MOS Devices," IEEE Electron Device Letters, vol. 22, No. 9, Sep. 2001, pp. 441-443.
J. W. Lyding et al.—"Reduction of hot electron degradation in metal oxide semiconductor transistors by deuterium processing," Appl. Phys. Lett. 68 (18), Apr. 29, 1996, pp. 2526-2528.
A. Stesmans—"Revision of $H_2$ passivation of $P_b$ interface defects in standard (111)Si/$SiO_2$," Appl. Phys. Lett. 68 (19), May 1996, pp. 2723-2725.

* cited by examiner

*Primary Examiner* — Andy Huynh
(74) *Attorney, Agent, or Firm* — Dickstein Shapiro LLP (57) ABSTRACT

A pixel cell with a photo-conversion device and at least one structure includes a deuterated material adjacent the photo-conversion device.

22 Claims, 10 Drawing Sheets

DEUTERATED STRUCTURES FOR IMAGE SENSORS AND METHODS FOR FORMING THE SAME

FIELD OF THE INVENTION

The present invention relates generally to the field of semiconductor devices and more particularly to trench isolation technology for use in semiconductor devices, including CMOS image sensors.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor, for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41 (3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

Figure 1:
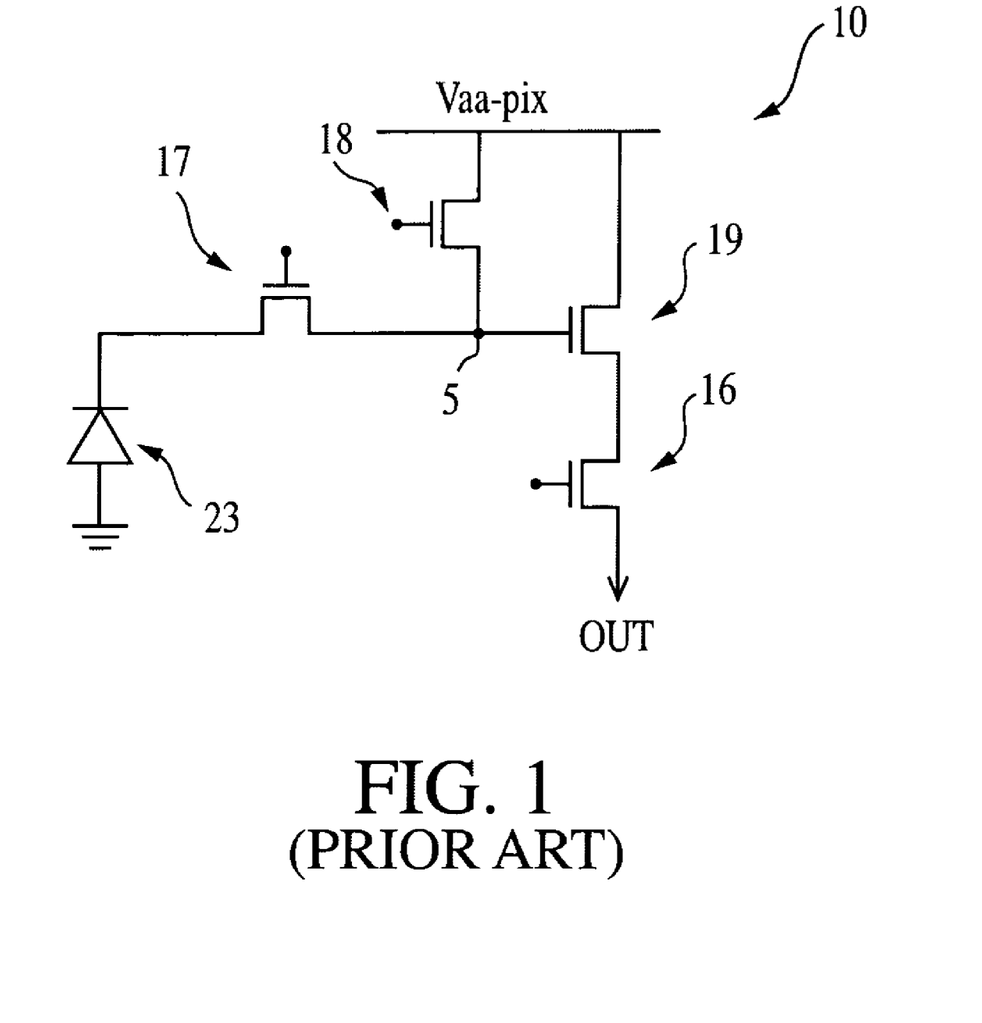
FIG. 1 is a schematic diagram of a conventional pixel cell.

A schematic diagram of a conventional CMOS pixel cell 10 is shown in FIG. 1. The illustrated CMOS pixel cell 10 is a four transistor (4T) cell. The CMOS pixel cell 10 generally comprises a photo-conversion device 23 for generating and collecting charge generated by light incident on the pixel cell 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel cell 10 also includes a reset transistor 18 for resetting the floating diffusion region 5 to a predetermined voltage; and a row select transistor 16 for outputting a signal from the source follower transistor 19 to an output terminal in response to an address signal.

Figure 2:
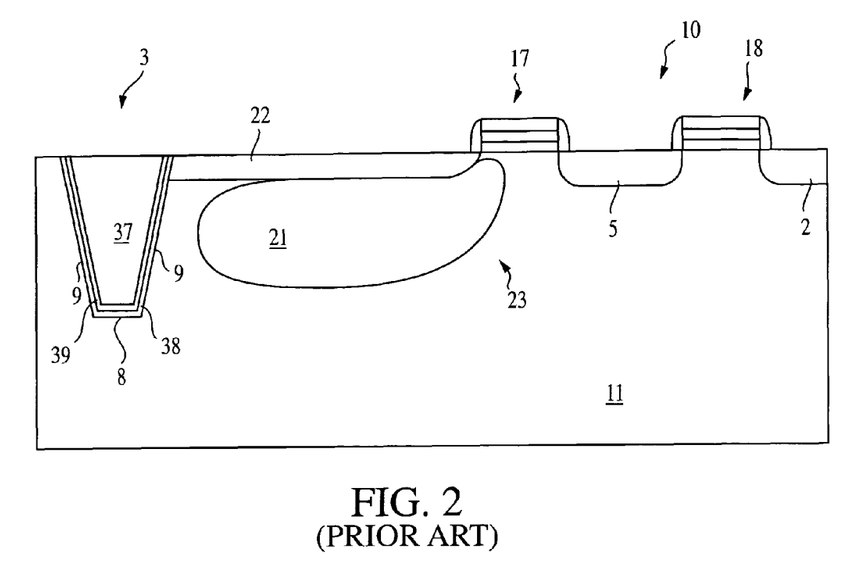
FIG. 2 is a cross sectional side view of a conventional pixel cell.

FIG. 2 is a cross-sectional view of the pixel cell 10 of FIG. 1 depicting the photo-conversion device 23. The exemplary CMOS pixel cell 10 has a photo-conversion device 23, which may be formed as a pinned photodiode. The photodiode 23 has a p-n-p construction comprising a p-type surface layer 22 and an n-type photodiode region 21 within a p-type active layer 11. The photodiode 23 is adjacent to and partially underneath the transfer transistor 17. The reset transistor 18 is on a side of the transfer transistor 17 opposite the photodiode 23.

As shown in FIG. 2, the reset transistor 18 includes a source/drain region 2. The floating diffusion region 5 is between the transfer and reset transistors 17, 18.

In the CMOS pixel cell 10 depicted in FIGS. 1 and 2, electrons are generated by light incident on the photo-conversion device 23 and are stored in the n-type photodiode region 21. These charges are transferred to the floating diffusion region 5 by the transfer transistor 17 when the transfer transistor 17 is activated. The source follower transistor 19 produces an output signal from the transferred charges. A maximum output signal is proportional to the number of electrons extracted from the n-type photodiode region 21.

Conventionally, a shallow trench isolation (STI) region 3 adjacent to the charge collection region 21 is used to isolate the pixel cell 10 from other pixel cells and devices of the image sensor. The STI region 3 is typically formed using a conventional STI process. The STI region 3 is typically lined with an oxide liner 38 and filled with a dielectric material 37. Also, the STI region 3 can include a nitride liner 39 between the oxide liner 38 and the dielectric material 37.

The nitride liner 39 provides several benefits, including improved corner rounding near the STI region 3 corners. The nitride liner 39 typically has tensile stress. Since the dielectric material 37 typically introduces compressive stress, the presence of the nitride liner 39 results in an overall decrease in stress levels. Reduced stress levels provide decreased leakage currents in the photo-conversion device 23. Particularly, leakage from trap-assisted tunneling and trap-to-trap tunneling mechanisms is decreased.

A common problem associated with the above described STI region 3 is dangling bonds (e.g., dangling Si— bonds) at the surface of the substrate 11 along the trench bottom 8 and sidewalls 9. The dangling bonds create a high density of trap sites along the trench bottom 8 and sidewalls 9. These trap sites are normally uncharged but become charged when electrons and holes become trapped in the sites. As a result of these trap sites formed along the bottom 8 and sidewalls 9 of the STI region 3, current generation near and along the trench bottom 8 and sidewalls 9 can be significant. Current generated from trap sites inside or near the photodiode 23 depletion region causes undesired dark current and an increase in fixed pattern noise.

Conventionally, hydrogen passivation is used to reduce the dangling bonds. However, the nitride liner 39 acts as a diffusion barrier for hydrogen ($H_2$) during passivation and reduces passivation of the dangling bonds. Therefore, when the nitride liner 39 is used dark current may increase.

It is desirable to have an isolation region with a nitride liner and reduced dangling bonds.

BRIEF SUMMARY OF THE INVENTION

Exemplary embodiments of the invention provide a pixel cell having a photo-conversion device and at least one structure including a deuterated material adjacent the photo-conversion device.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a representative pixel cell is illustrated in the figures and description herein, and typically fabrication of all pixel cells in an image sensor will proceed concurrently and in a similar fashion.

Figure 3:
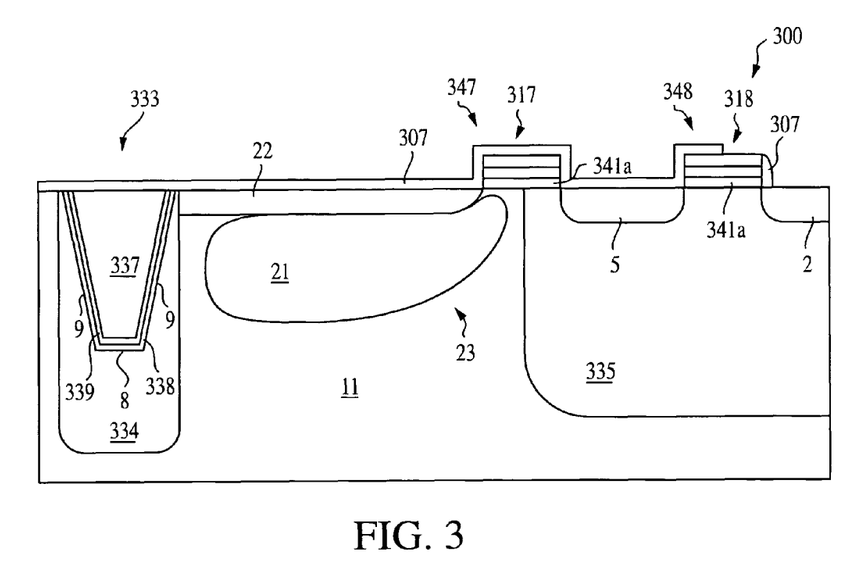
FIG. 3 is a cross sectional side view of a pixel cell according to an exemplary embodiment of the invention.

FIG. 3 is a cross-sectional view of a pixel cell 300 according to an exemplary embodiment of the invention. The pixel cell 300 is similar to the pixel cell 10 depicted in FIGS. 1 and 2, except that one or more of the pixel cell 300 structures includes a material containing deuterium, rather than the conventional structures that contain hydrogen. In particular, the pixel cell 300 includes an improved isolation region 333, which has a deuterated nitride liner 339 and a deuterated oxide liner 338, and an improved transfer transistor 317 gate stack 347, which has a deuterated gate oxide layer 341a. The pixel cell 300 also includes as deuterated oxide layer 307 over the transfer gate stack 347, the photodiode 23, the floating diffusion region 5, and portions of the reset gate stack 348.

Further, the pixel cell 300 may include a first conductivity type doped well, e.g., a p-type well 334 surrounding the isolation region 333 and a p-type well 335 below the floating diffusion region 5, the reset transistor 318, and a portion of the transfer transistor 317. Although not shown in FIG. 3, the pixel cell 300 also includes source follower and row select transistors 19, 16, respectively (as shown in FIG. 1).

Recently, deuterium has been shown to be a far superior passivating species than hydrogen by a factor of 30. See e.g., Cheng et al., *Improved Hot-Carrier Reliability of SOI Transistors by Deuterium Passivation of Defects at Oxide/Silicon Interfaces*, IEEE Transactions on Electron Devices, Vol. 49., No. 3, March 2002, pgs. 529-531. See also, Tseng et al., *ALD HfO$_2$ Heavy Water (D$_2$O) for improved MOSFET Stability*, Electron Devices Meeting, 2003. IEDM '03 Technical Digest, IEEE International, December 2003, pp. 4.1.1-4.1.4, which is incorporated herein by reference. In essence, deuterium is an isotope of hydrogen and possesses a larger molecular size and is less susceptible than hydrogen to being displaced by hot carriers. The deuterated structures 338, 339, 341a, 307 serve as a solid source of deuterium, which improves the passivation of dangling bonds. The deuterated liners 338, 339, in particular, improve the passivation of dangling bonds along the isolation region sidewalls 9 and bottom 8, thereby reducing dark current.

The passivation of a silicon dangling bond by hydrogen (H) requires an activation energy of 1.51 eV (Si$^-$+H$_2$=Si—H+H). Passivation of a silicon dangling bond by deuterium (D) requires an analogous activation energy of 1.51 eV (Si$^-$+D$_2$=Si–D+D). Whereas, replacing a hydrogen-passivated bond by deuterium (Si—H+D$_2$=Si=D+HD) requires an activation energy of 1.84 eV. As a result, deuterium incorporation at the substrate 11/oxide liner 338 interface is largely limited by the replacement of pre-existing hydrogen with deuterium.

FIGS. 4A-4K depict the formation of pixel cell 300 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 4A:
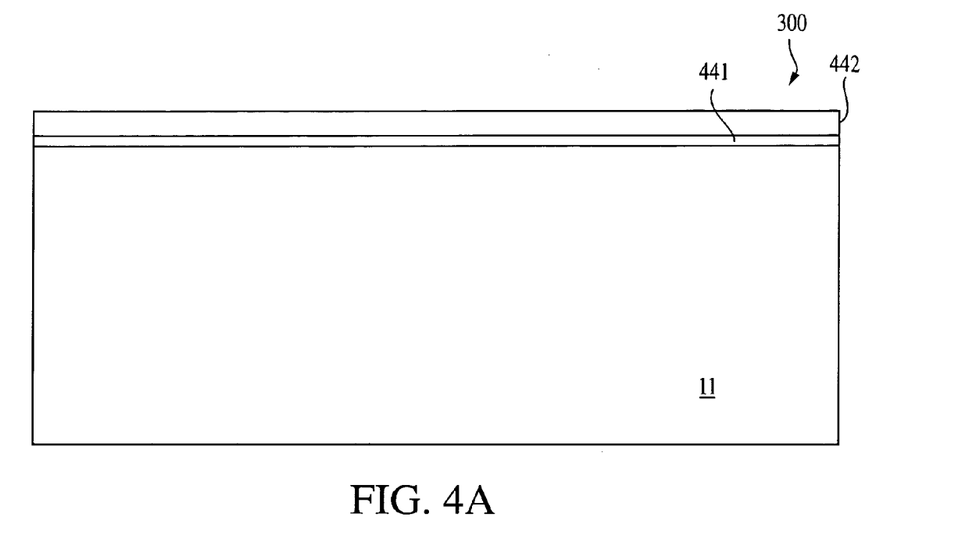
FIG. 4A depicts the pixel cell of FIG. 3 at an initial stage of processing.

As illustrated in FIG. 4A, a pad oxide layer 441 is formed on the substrate 11. Preferably, the pad oxide layer 441 is formed as a deuterated pad oxide layer. The deuterated pad oxide layer 441 can be formed, for example, by thermal oxidation in the presence of heavy water (D$_2$O). If desired, the pad oxide layer 441 can instead be formed as a conventional (non-deuterated) pad oxide layer 441.

A sacrificial layer 442 is formed on the deuterated pad oxide layer 441. In the illustrated embodiment, the sacrificial layer 442 is a deuterated silicon nitride layer. As is know in the art, a deuterium containing nitride material can be formed by using deuterium-containing compound (e.g., ammonia (ND$_3$) and silane (SiD$_4$)) instead of a hydrogen-containing compound (e.g., ammonia (NH$_3$) and silane (SiH$_4$)). In this manner the deuterated silicon nitride layer 442 can be formed. If desired, the sacrificial layer 442 can instead be a conventional nitride layer or a dielectric anti-reflective coating (DARC) layer formed by known methods.

Figure 4B:
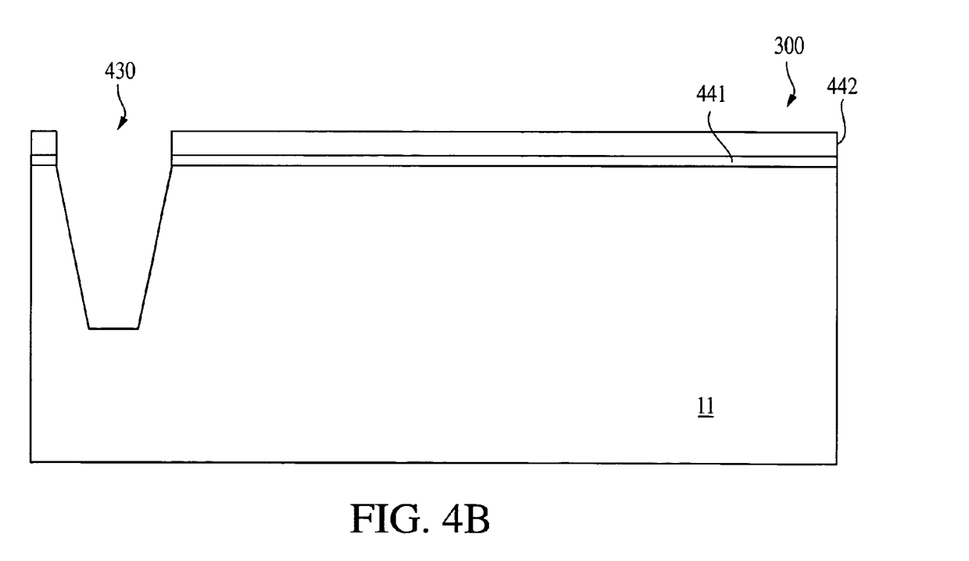
FIGS. 4B-4K depict the pixel cell of FIG. 3 at intermediate stages of processing.

FIG. 4B depicts the formation of a trench 430 in the substrate 11 and through the layers 441, 442 on the substrate 11. The trench 430 can be formed by any known technique. For example, a photoresist mask (not shown), either positive or negative resist (preferably positive) as known in the art, is applied over the sacrificial layer 442 and patterned using standard photolithographic patterning techniques. The sacrificial layer 442 and the pad oxide layer 441 are etched by a dry etch process. The etch process is allowed to continue into the substrate 11 to form the trench 430. In one implementation, the trench 430 extends into the substrate 11 to a depth of approximately 1000 Å to approximately 8000 Å. An anisotropic etch such as a plasma or reactive ion etch (RIE) process can be used as the dry etch. The photoresist mask (not shown) is removed using standard photoresist stripping techniques, preferably by a plasma etch.

Figure 4C:
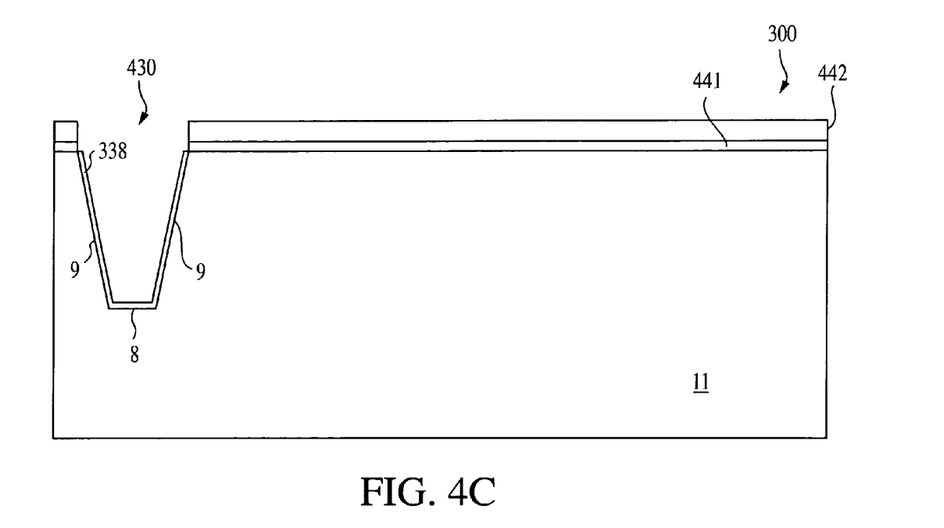

A thin layer of oxide 338, between approximately 50 Å and approximately 150 Å thick, is formed on the trench 430 sidewalls 9 and bottom 8, as shown in FIG. 4C. Preferably, the oxide layer 338 is a deuterated oxide layer. The deuterated oxide layer 338 is formed similarly to the deuterated pad oxide layer 441, as described above in connection with FIG. 4A. Alternatively, the trench 430 can be lined with a conventional oxide layer.

Optionally, before or after the oxide layer 338 is formed, deuterium can be implanted into the oxide layer 338 and trench 430 sidewalls 9 and bottom 8. The deuterium implant increases the deuterium concentration at the oxide 338/substrate 11 interface. The deuterium implant can be conducted by methods known in the art. For example, a mask (e.g., photoresist) (not shown) can formed over the substrate 11 and patterned to provide an opening to the trench 430. According to an embodiment of the invention, the implant dose is within the range of approximately $1 \times 10^{13}$ atoms/cm$^2$ to approximately $1 \times 10^{15}$ atoms/cm$^2$ at an energy within the range of approximately 10 keV to approximately 100 keV. Preferably, the implant dose is approximately $2 \times 10^{14}$ atoms/cm$^2$ at an energy of approximately 40 keV. After the implant, an inert anneal step is conducted at a temperature within the range of approximately 800 degrees Celsius (° C.) to approximately 1000° C. for approximately 10 minutes to approximately 30 minutes. Preferably the inert anneal step is conducted at approximately 850° C. for approximately 20 minutes.

Alternatively, the deuterium implant and inert anneal steps can instead be conducted after the formation of the nitride liner 339 described below in connection with FIG. 4D.

Figure 4D:
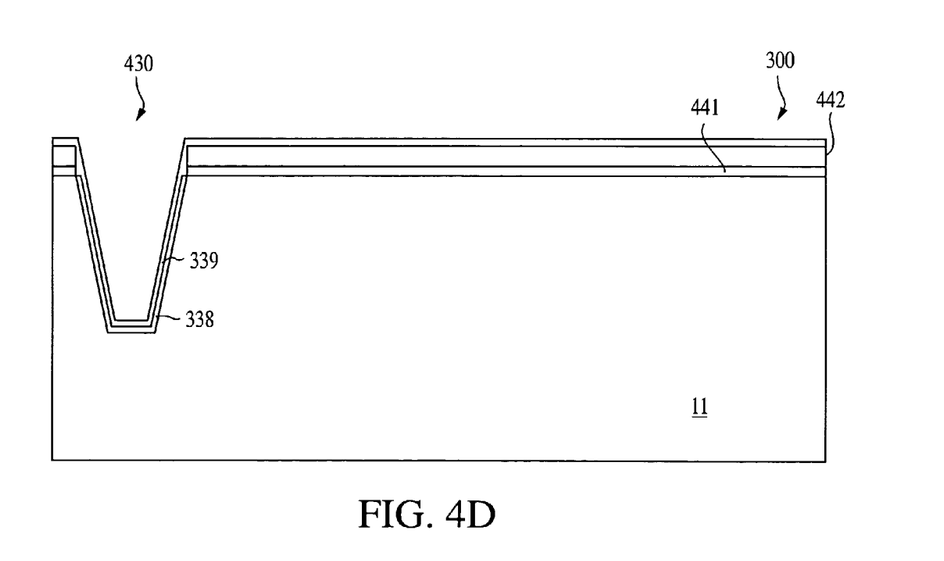

As depicted in FIG. 4D, the trench 430 is lined with a nitride liner 339. Preferably, the nitride liner 339 is a deuterated nitride liner, e.g., deuterated silicon nitride. The deuterated nitride liner 339 is formed by any suitable technique, to a thickness within the range of approximately 50 Å to approximately 150 Å. For example, the deuterated nitride liner 339 can be deposited using deuterium-containing compound (e.g., ammonia ($ND_3$) and silane ($SiD_4$)). Alternatively, the trench 430 can be lined a conventional nitride liner, or can lack a nitride liner.

Optionally, once the nitride liner 339 is formed, a high pressure deuterium anneal can be conducted, which serves to increase the incorporation of deuterium at the oxide 338/substrate 11 interface. The high pressure anneal is conducted at a pressure within the range of approximately 1 atmosphere (atm) to approximately 5 atm at a temperature within the range of approximately 300° C. to approximately 500° C. The anneal time is within the range of approximately 30 minutes to approximately 120 minutes. Preferably the high pressure anneal is conducted at a pressure of approximately 5 atm at a temperature of approximately 400° C. for approximately 30 minutes.

Figure 4E:
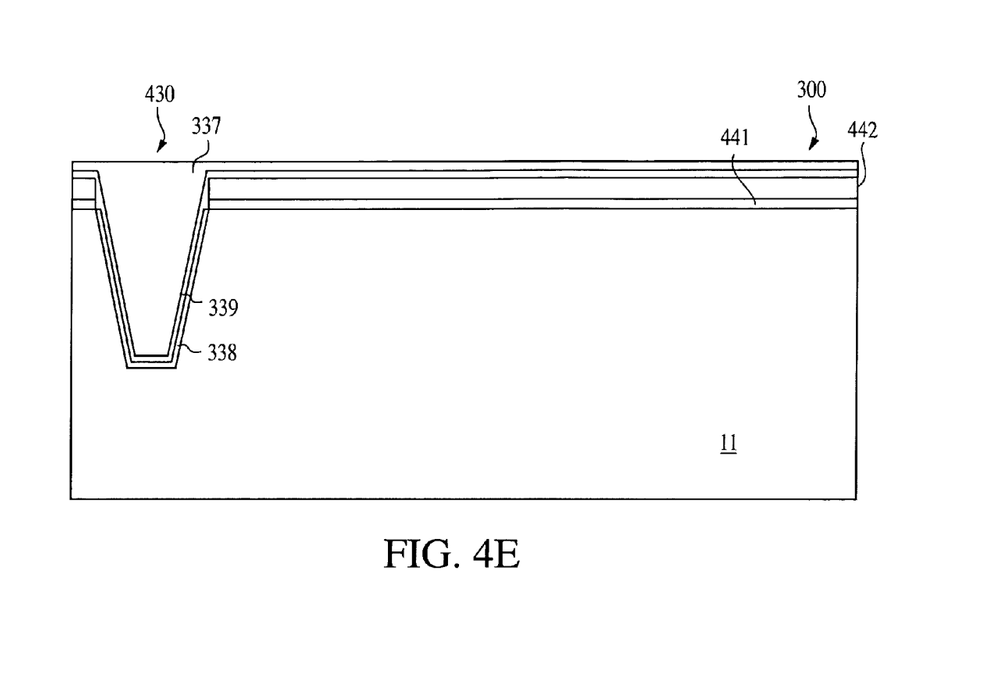

The trench 430 is then filled with a dielectric material 337 as shown in FIG. 4E. The dielectric material 337 may be an oxide material, for example a silicon oxide, such as SiO or $SiO_2$; oxynitride; a nitride material, such as silicon nitride; silicon carbide; a high temperature polymer; or other suitable dielectric material. In the illustrated embodiment, the dielectric material 337 is a high density plasma (HDP) oxide.

Figure 4F:
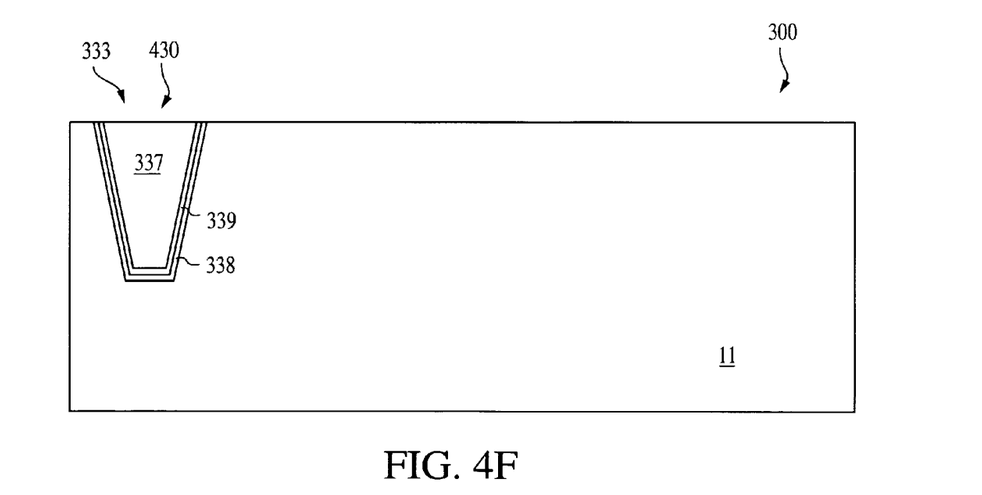

A chemical mechanical polish (CMP) step is conducted to remove the nitride layer 442 over the surface of the substrate 11 outside the trench 430, as shown in FIG. 4F. Also, the pad oxide layer 441 is removed, for example, using a field wet buffered-oxide etch step and a clean step.

Figure 4G:
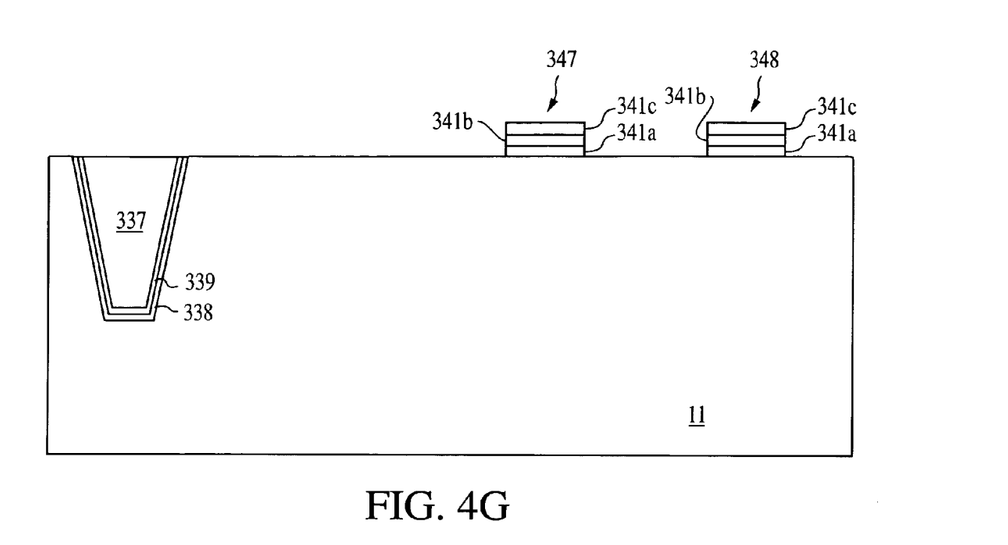

FIG. 4G depicts the formation of the transfer transistor 317 (FIG. 3) gate stack 347 and the reset transistor 318 (FIG. 3) gate stack 348. A first insulating layer 341a is formed on the substrate 11. Preferably, the first insulating layer is a deuterated oxide layer, for example, deuterated silicon oxide. The deuterated oxide layer 341a serves as the gate oxide layer 341a for the subsequently formed transistor gate 341b. Alternatively, the gate oxide layer 341a in one or more of the gate stacks 347, 348 can be formed without deuterium.

Next, a layer of conductive material 341b is deposited over the deuterated oxide layer 341a. The conductive layer 341b serves as the gate electrode for the transistors 317, 318 (FIG. 3). The conductive layer 341b may be a layer of polysilicon, which may be doped to a second conductivity type, e.g., n-type. A second insulating layer 341c is deposited over the conductive layer 341b. The insulating layer 341c may be formed of, for example, an oxide ($SiO_2$), a nitride (silicon nitride), an oxynitride (silicon oxynitride), ON (oxide-nitride), NO (nitride-oxide), or ONO (oxide-nitride-oxide).

The conductive layer 341b and the second insulating layer 341c may be formed by conventional deposition methods, such as chemical vapor deposition (CVD) or plasma enhanced chemical vapor deposition (PECVD), among others. The layers 341a, 341b, 341c are then patterned and etched to form the multilayer gate stacks 347, 348 shown in FIG. 4G.

The invention is not limited to the structure of the gate stacks 347, 348 described above. Additional layers may be added or the gate stacks 347, 348 may be altered as is desired and known in the art. For example, a silcide layer (not shown) may be formed between the gate electrodes 341b and the second insulating layers 341c. The silicide layer may be included in the gate stacks 347, 348, or in all of the transistor gate stack structures in an image sensor circuit, and may be titanium silicide, tungsten silicide, cobalt silicide, molybdenum silicide, or tantalum silicide. This additional conductive layer may also be a barrier layer/refractor metal, such as titanium nitride/tungsten (TiN/W) or tungsten nitride/tungsten ($WN_x$/W), or it could be formed entirely of tungsten nitride ($WN_x$).

Although not shown, the source follower and row select transistors 19, 16 (FIG. 1), respectively, can be formed concurrently with and in the same manner as the transfer and reset transistors 317, 318 as described below. Accordingly, the source follower and row select transistors 19, 16 may or may not have deuterated gate oxide layers 341a.

Figure 4H:
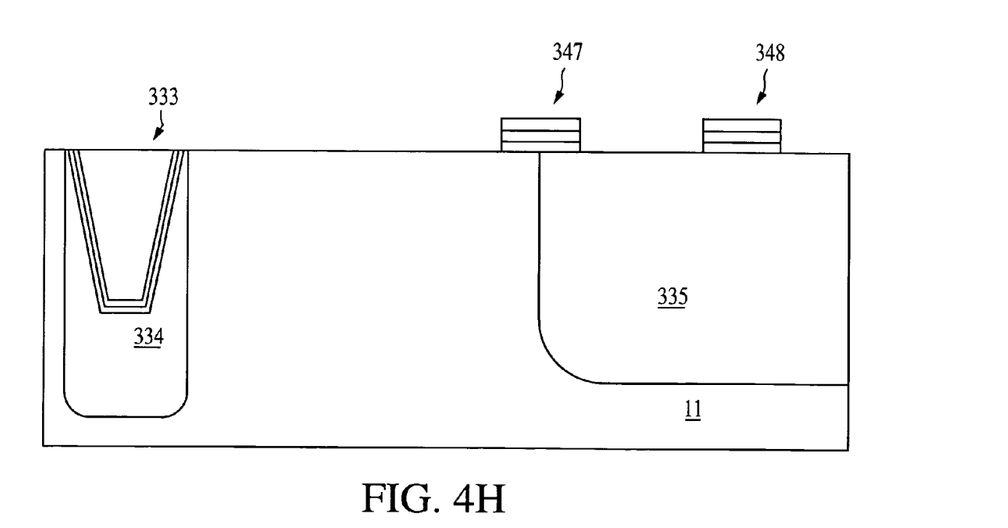

Doped p-type wells 334, 335 are implanted into the substrate 11, as shown in FIG. 4H. The first p-well 334 is formed in the substrate 11 surrounding the isolation region 333 and extending below the isolation region 333. The second p-well 335 is formed in the substrate 11 from a point below the transfer gate stack 347 extending in a direction in the substrate 11 away from where the photodiode 23 (FIG. 3) is to be formed. The p-wells 334, 335 are formed by known methods. For example, a layer of photoresist (not shown) can be patterned over the substrate 11 having an opening over the area where the p-wells, 334, 335 are to be formed. A p-type dopant, such as boron, can be implanted into the substrate 11 through the opening in the photoresist. The p-wells 334, 335 are formed having a p-type dopant concentration that is higher than adjacent portions of the substrate 11. Alternatively, the p-wells 334, 335 can be formed prior to the formation of the trench 430.

Figure 4I:
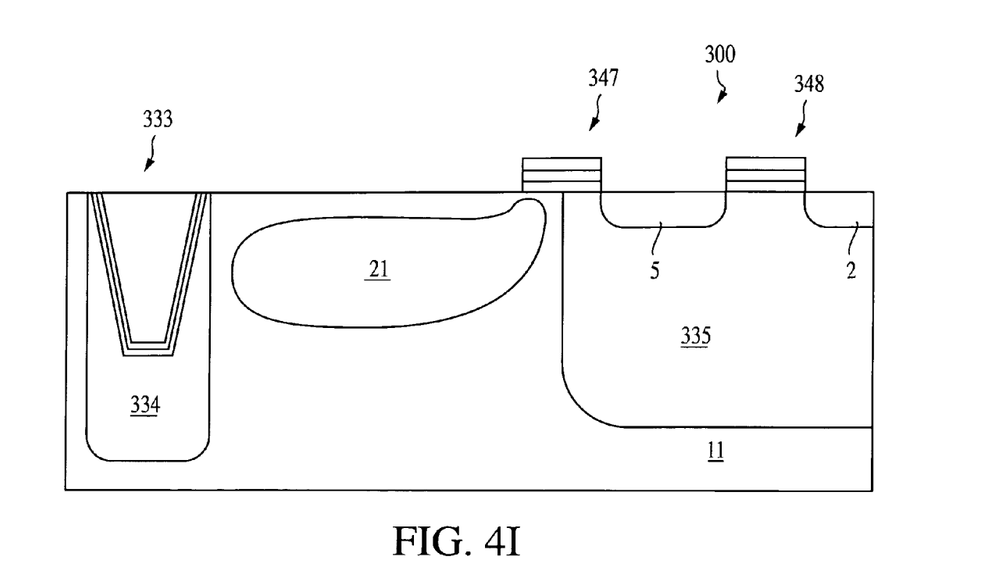

As depicted in FIG. 4I, a doped n-type region 21 is implanted in the substrate 11 (for the photodiode 23 of FIG. 3). For example, a layer of photoresist (not shown) may be patterned over the substrate 11 having an opening over the surface of the substrate 11 where photodiode 23 (FIG. 3) is to be formed. An n-type dopant, such as phosphorus, arsenic, or antimony, may be implanted through the opening and into the substrate 11. Multiple implants may be used to tailor the profile of region 21. If desired, an angled implantation may be conducted to form the doped region 21, such that implantation is carried out at angles other than 90 degrees relative to the surface of the substrate 11.

As shown in FIG. 4I, the n-type region 21 is formed from a point adjacent the transfer gate stack 347 and extending in the substrate 11 between the gate stack 347 and the isolation region 333. The region 21 forms a photosensitive charge accumulating region for collecting photo-generated charge.

The floating diffusion region 5 and source/drain region 2 are implanted by known methods to achieve the structure shown in FIG. 4I. The floating diffusion region 5 and source/drain region 2 are formed as n-type regions. Any suitable n-type dopant, such as phosphorus, arsenic, or antimony, may be used. The floating diffusion region 5 is formed on the side of the transfer gate stack 347 opposite the n-type photodiode region 21. The source/drain region 2 is formed on a side of the reset gate stack 348 opposite the floating diffusion region 5.

Figure 4J:
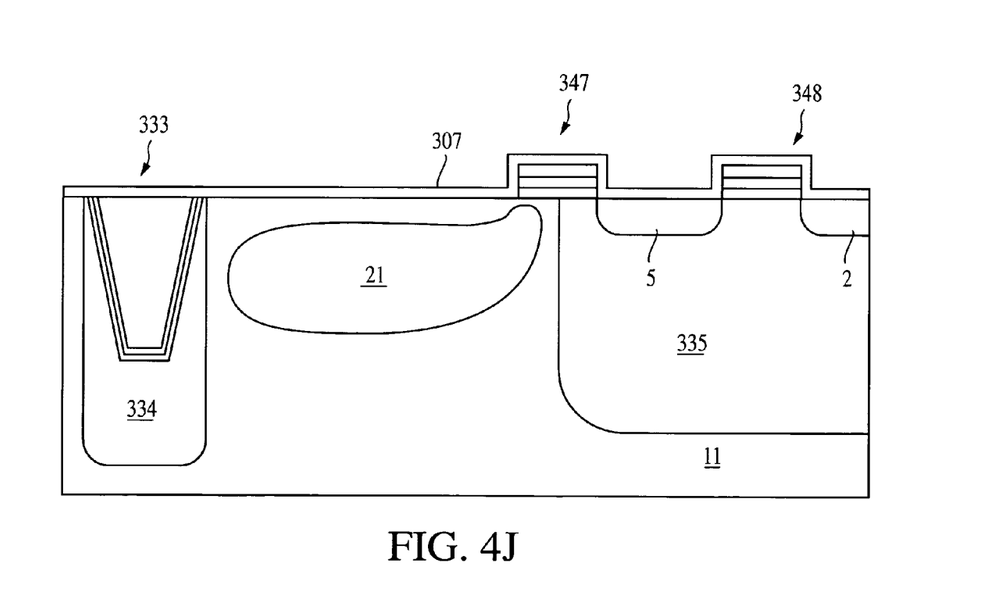

FIG. 4J depicts the formation of a dielectric layer 307. Illustratively, layer 307 is a deuterated oxide layer, but layer 307 may be any appropriate deuterated dielectric material, such as a deuterated nitride, among others, formed by methods known in the art. Alternatively, the dielectric layer 307 can be formed without deuterium.

Figure 4K:
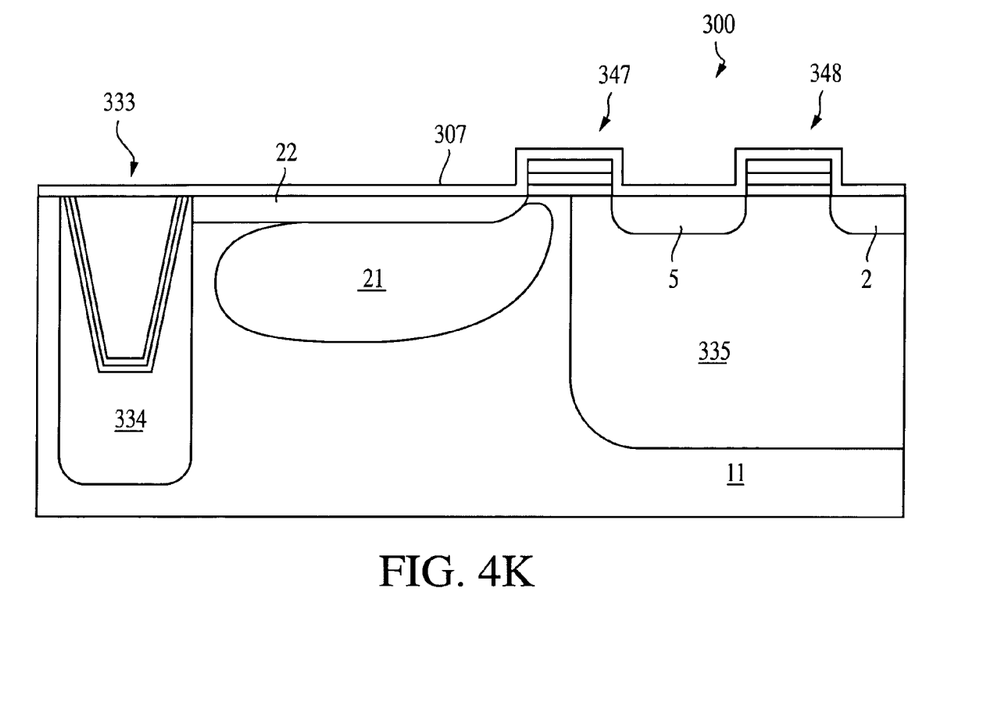

The doped surface layer 22 for the photodiode 23 is implanted, as illustrated in FIG. 4K. Doped surface layer 22 is formed as a highly doped p-type surface layer and is formed to a depth of approximately 0.1 µm. A p-type dopant, such as boron, indium, or any other suitable p-type dopant, may be used to form the p-type surface layer 22.

The p-type surface layer 22 may be formed by known techniques. For example, layer 22 may be formed by implanting p-type ions through openings in a layer of photoresist. Alternatively, layer 22 may be formed by a gas source plasma doping process, or by diffusing a p-type dopant into the substrate 11 from an in-situ doped layer or a doped oxide layer deposited over the area where layer 22 is to be formed.

The deuterated oxide layer 307 is etched such that remaining portions form a sidewall spacer on a sidewall of the reset gate stack 348. The layer 307 remains over the transfer gate stack 347, the photodiode 23, the floating diffusion region 5, and a portion of the reset gate stack 348 to achieve the structure shown in FIG. 3. Alternatively, a dry etch step can be conducted to etch portions of the deuterated oxide layer 307 such that only sidewall spacers (not shown) remain on the transfer gate stack 347 and the reset gate stack 348.

Conventional processing methods can be used to form other structures of the pixel 300. For example, insulating, shielding, and metallization layers to connect gate lines, and other connections to the pixel 300 may be formed. Also, the entire surface may be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide contacts. Conventional layers of conductors and insulators may also be used to interconnect the structures and to connect pixel 300 to peripheral circuitry.

While the pixel cell 300 is described including multiple deuterated structures, embodiments of the invention include a pixel cell having only one of the deuterated structures and a pixel cell having fewer deuterated structures than are described above in connection with the embodiment of FIG. 3.

While the above embodiments are described in connection with the formation of p-n-p-type photodiodes the invention is not limited to these embodiments. The invention also has applicability to other types of photo-conversion devices, such as a photodiode formed from n-p or n-p-n regions in a substrate, a photogate, or a photoconductor. If an n-p-n-type photodiode is formed the dopant and conductivity types of all structures would change accordingly.

Although the above embodiments are described in connection with 4T pixel cell 300, the configuration of pixel cell 300 is only exemplary and the invention may also be incorporated into other pixel circuits having different numbers of transistors. Without being limiting, such a circuit may include a three-transistor (3T) pixel cell, a five-transistor (5T) pixel cell, a six-transistor (6T) pixel cell, and a seven-transistor pixel cell (7T). A 3T cell omits the transfer transistor, but may have a reset transistor adjacent to a photodiode. The 5T, 6T, and 7T pixel cells differ from the 4T pixel cell by the addition of one, two, or three transistors, respectively, such as a shutter transistor, a CMOS photogate transistor, and an anti-blooming transistor.

Figure 5:
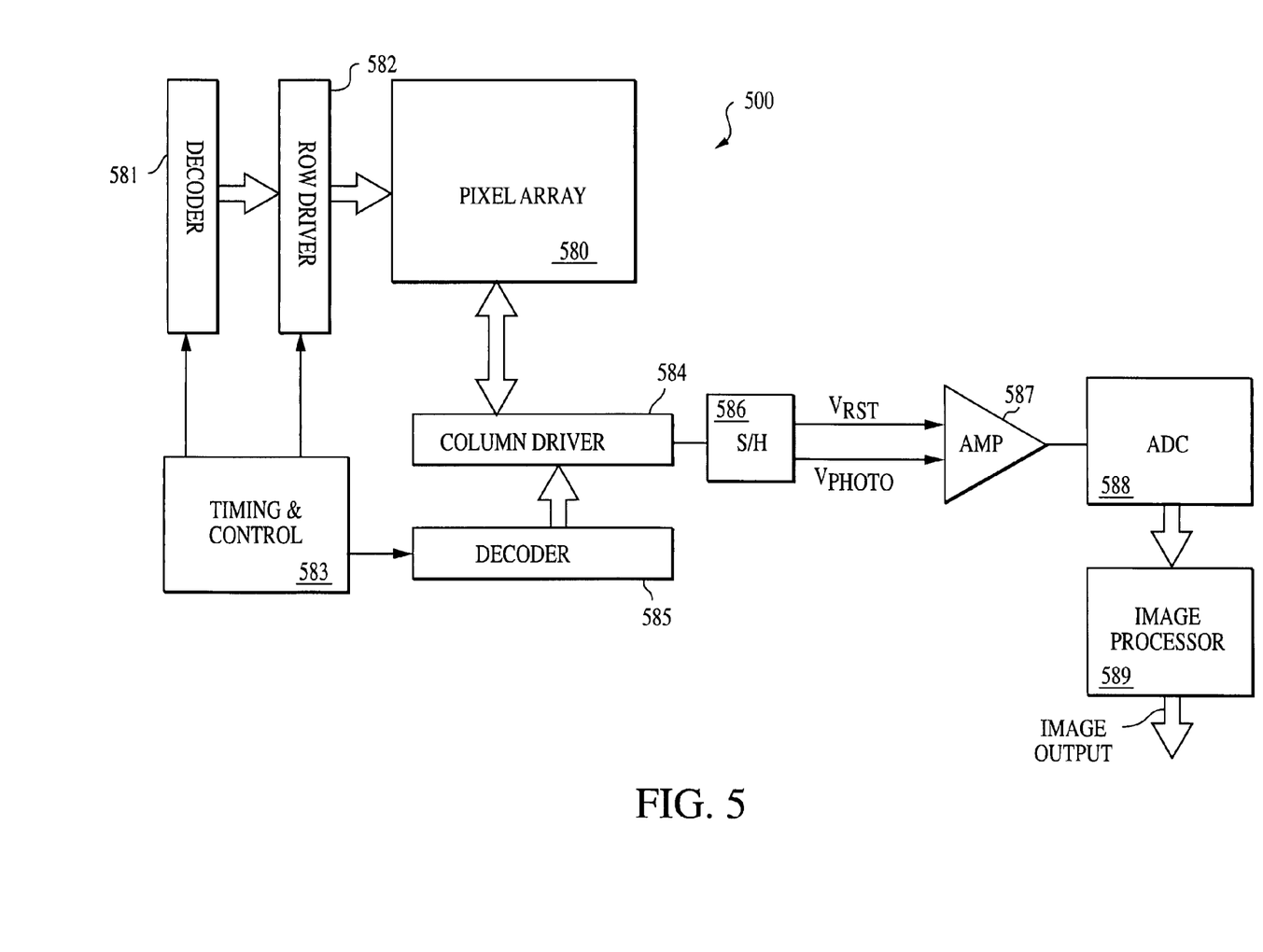
FIG. 5 is a block diagram of a CMOS image sensor according to an exemplary embodiment of the invention.

A typical single chip CMOS image sensor 500 is illustrated by the block diagram of FIG. 5. The image sensor 500 includes a pixel cell array 580 having one or more pixel cells 300 (FIG. 3) described above. The pixel cells 300 of array 580 are arranged in a predetermined number of columns and rows.

Referring to FIGS. 3 and 5, in operation, the rows of pixel cells 300 in array 580 are read out one by one. Accordingly, pixel cells 300 in a row of array 580 are all selected for readout at the same time by a row select line, and each pixel cell 300 in a selected row provides a signal representative of received light to a readout line for its column. In the array 580, each column also has a select line, and the pixel cells 300 of each column are selectively read out in response to the column select lines.

The row lines in the array 580 are selectively activated by a row driver 582 in response to row address decoder 581. The column select lines are selectively activated by a column driver 584 in response to column address decoder 585. The array 580 is operated by the timing and control circuit 583, which controls address decoders 581, 585 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 586 in response to the column driver 584. A differential signal ($V_{rst}-V_{photo}$) is produced by differential amplifier (AMP) 587 for each pixel cell, and each pixel cell's differential signal is digitized by analog-to-digital converter (ADC) 588. The analog-to-digital converter 588 supplies the digitized pixel signals to an image processor 589, which performs appropriate image processing before providing digital signals defining an image output.

Figure 6:
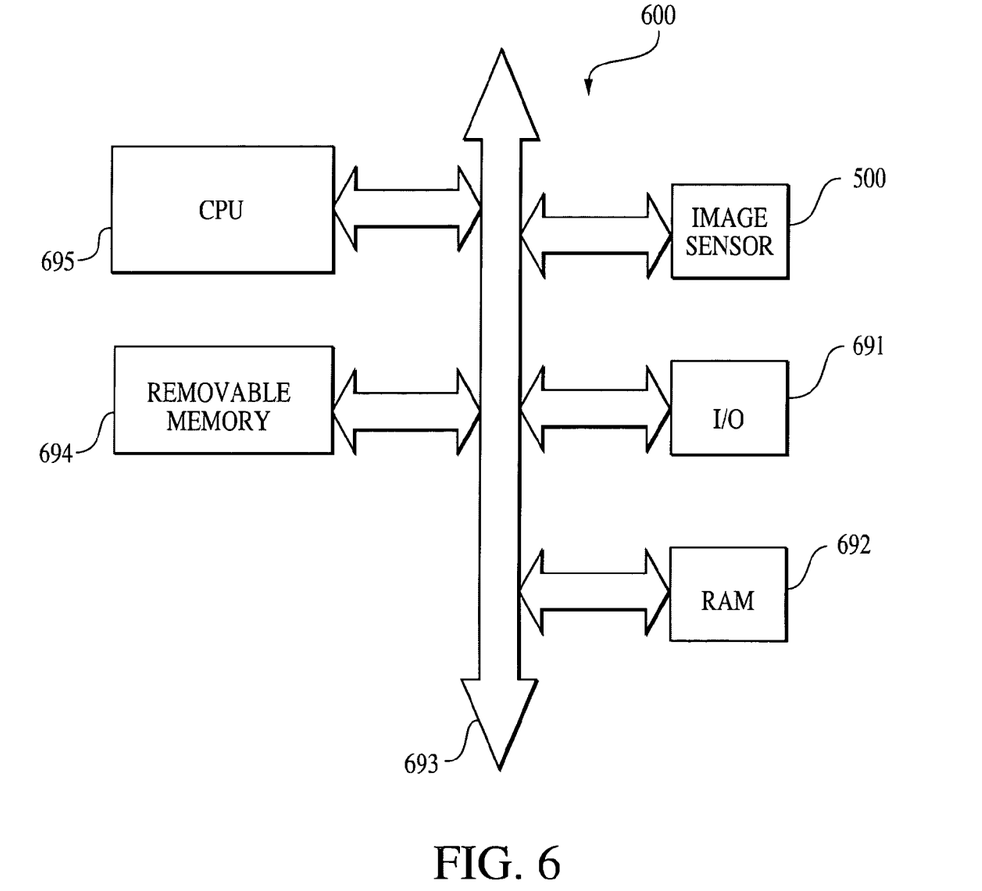
FIG. 6 is a schematic diagram of a computer processor system incorporating the CMOS image sensor of FIG. 5.

FIG. 6 illustrates a processor-based system 600 including an image sensor 500 of FIG. 5. The processor-based system 600 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 600, for example a camera system, generally comprises a central processing unit (CPU) 695, such as a microprocessor, that communicates with an input/output (I/O) device 691 over a bus 693. Image sensor 500 also communicates with the CPU 695 over bus 693. The processor-based system 600 also includes random access memory (RAM) 692, and can include removable memory 694, such as flash memory, which also communicate with CPU 695 over the bus 693. Image sensor 500 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
    a photo-conversion device formed in a substrate; and
    an isolation region comprising:
        a trench formed in a doped well of a first conductivity type, wherein the doped well is formed in the substrate adjacent to the photo-conversion device;
        a deuterated oxide liner formed on sidewalls and a bottom surface of the trench; and
        a deuterated nitride liner formed on the deuterated oxide liner,
        wherein a surface of the doped well along the sidewalls and the bottom of the trench includes a deuterium implant.

2. The pixel cell of claim 1, wherein the deuterated nitride liner has a thickness within the range of approximately 50 Å to approximately 150 Å.

3. The pixel cell of claim 1, wherein the deuterated oxide liner has a thickness within the range of approximately 50 Å to approximately 150 Å.

4. The pixel cell of claim 1, wherein the trench further contains a dielectric material selected from the group consisting of high density plasma oxide, silicon oxide, oxynitride, nitride, silicon carbide and high temperature polymer.

5. The pixel cell of claim 1, further comprising a transistor coupled to the photo-conversion device, the transistor comprising a deuterated gate oxide layer.

6. The pixel cell of claim 1, further comprising a deuterated dielectric layer over the photo-conversion device.

7. The pixel cell of claim 6, wherein the deuterated dielectric layer extends over at least one transistor gate and a floating diffusion region.

8. The pixel cell of claim 1, wherein the photo-conversion device is a photodiode.

9. The pixel cell of claim 1, wherein a dopant concentration of the doped well is higher than a dopant concentration of the substrate.

10. The pixel cell of claim 1, wherein the photo-conversion device comprises a first region of a first conductivity type formed over a second region of a second conductivity type, the first conductivity type of the first region being the same as the first conductivity type of the doped well.

11. The pixel cell of claim 10, wherein a dopant concentration of the first region of the photo-conversion device is higher than a dopant concentration of the substrate.

12. A pixel cell comprising:
    a pinned photodiode formed in a substrate; and
    a shallow trench isolation region formed in a doped well of a first conductivity type, wherein the shallow trench isolation region is lined with a deuterated oxide liner and a deuterated nitride liner and the doped well is formed in the substrate adjacent to the pinned photodiode, wherein a surface of the doped well along sidewalls and a bottom of the trench includes a deuterium implant.

13. A pixel cell comprising:
    a pinned photodiode formed in a substrate;
    a shallow trench isolation region formed in a doped well of a first conductivity type, wherein the shallow trench isolation region is lined with a deuterated oxide liner and a deuterated nitride liner and the doped well is formed in the substrate adjacent to the pinned photodiode, and wherein a surface of the doped well along sidewalls and a bottom of the trench includes a deuterium implant;
    a transistor coupled to the pinned photodiode, the transistor comprising a deuterated gate oxide layer; and
    a deuterated dielectric layer formed over the pinned photodiode.

14. An image sensor comprising:
    an array of pixel cells, at least one of the pixel cells comprising:
        a photo-conversion device formed in a substrate, and
        an isolation region comprising a trench formed in a doped well of a first conductivity type, wherein the doped well is formed in the substrate adjacent to the photo-conversion device, and wherein the trench is lined with a deuterated nitride liner and a deuterated oxide liner, wherein a surface of the doped well along sidewalls and a bottom of the trench includes a deuterium implant.

15. The image sensor of claim 14, wherein the deuterated nitride liner has a thickness within the range of approximately 50 Å to approximately 150 Å.

16. The image sensor of claim 14, wherein the oxide liner has a thickness within the range of approximately 50 Å to approximately 150 Å.

17. The image sensor of claim 14, wherein the trench further contains a dielectric material selected from the group consisting of high density plasma oxide, silicon oxide, oxynitride, nitride, silicon carbide and high temperature polymer.

18. The image sensor of claim 14, wherein at least one of the pixel cells further comprises a transistor coupled to the photo-conversion device, the transistor comprising a deuterated gate oxide layer.

19. The image sensor of claim 14, wherein at least one of the pixel cells further comprises a deuterated dielectric layer over the photo-conversion device.

20. The image sensor of claim 19, wherein the deuterated dielectric layer extends over at least one transistor gate and a floating diffusion region.

21. The image sensor of claim 14, wherein the photo-conversion device is a photodiode.

22. A processor-based system comprising:
    (i) a processor; and
    (ii) an image sensor coupled to the processor, the image sensor comprising:
        a substrate; and
        an array of pixel cells, at least one of the pixel cells comprising:
            a photo-conversion device formed in a substrate,
            an isolation region comprising:
                a trench formed in a doped well of a first conductivity type, wherein the doped well is formed in the substrate adjacent to the photo-conversion device;
                a deuterated oxide liner formed on sidewalls and a bottom surface of the trench; and
                a deuterated nitride liner formed on the deuterated oxide liner,
                wherein a surface of the doped well along sidewalls and a bottom of the trench includes a deuterium implant; and
            a transistor coupled to the photo-conversion device, the transistor comprising a deuterated gate oxide layer.

* * * * *